United States Patent
Imai et al.

(10) Patent No.: US 7,050,769 B2
(45) Date of Patent: May 23, 2006

(54) ELECTRONIC APPARATUS AND DESIGN METHOD

(75) Inventors: Shun Imai, Komoro (JP); Hitoshi Akamine, Maebashi (JP); Takashi Ito, Komoro (JP); Satoshi Arai, Gunma (JP)

(73) Assignees: Hitachi ULSI Systems Co., Ltd., Tokyo (JP); Renesas Technology Corp., Tokyo (JP)

( * ) Notice: Subject to any disclaimer, the term of this patent is extended or adjusted under 35 U.S.C. 154(b) by 425 days.

(21) Appl. No.: 10/170,375

(22) Filed: Jun. 14, 2002

(65) Prior Publication Data

US 2003/0022638 A1   Jan. 30, 2003

(30) Foreign Application Priority Data

Jul. 27, 2001   (JP)   ............................. 2001-227190

(51) Int. Cl.
  *H04B 1/04*   (2006.01)
(52) U.S. Cl. ................................ 455/114.3; 455/127.1; 375/297
(58) Field of Classification Search ............. 455/127.1, 455/114.1, 114.2, 114.3; 375/296, 297; 333/32
See application file for complete search history.

(56) References Cited

U.S. PATENT DOCUMENTS

| | | | | |
|---|---|---|---|---|
| 4,656,364 | A * | 4/1987 | Yokogawa et al. | 307/112 |
| 6,023,611 | A * | 2/2000 | Bolin et al. | 455/114.1 |
| 6,466,770 | B1 * | 10/2002 | Griffith et al. | 455/91 |
| 6,608,527 | B1 * | 8/2003 | Moloudi et al. | 330/301 |
| 6,625,470 | B1 * | 9/2003 | Fourtet et al. | 455/127.4 |
| 6,628,176 | B1 * | 9/2003 | Okada | 333/32 |
| 6,738,601 | B1 * | 5/2004 | Rofougaran et al. | 455/66.1 |
| 6,778,020 | B1 * | 8/2004 | Ohta et al. | 330/302 |
| 6,867,662 | B1 * | 3/2005 | Uriu et al. | 333/132 |
| 2004/0114399 | A1 * | 6/2004 | Lincoln et al. | 363/56.02 |

FOREIGN PATENT DOCUMENTS

| | | | |
|---|---|---|---|
| JP | 409246889 A | * | 9/1997 |
| JP | 11-234062 | | 8/1999 |

* cited by examiner

*Primary Examiner*—Nguyen T. Vo
*Assistant Examiner*—Nhan T. Le
(74) *Attorney, Agent, or Firm*—Mattingly, Stanger, Malur & Brundidge, P.C.

(57) ABSTRACT

The invention realizes a wireless communication module that is capable of transmitting the fundamental wave with low loss and reducing the double higher harmonic wave level to a desired level or lower as the whole module. The invention provides a front end module to be used for a wireless communication system such as cellular phone in which at least an output power amplifier, a matching circuit, and a low-pass filter are mounted on one insulating substrate and these circuits are connected in the above-mentioned order, wherein the relative phase of the double higher harmonic wave impedance between phases in view of the matching circuit side and the low-pass filter side from the connection point between the matching circuit and the low-pass filter is set in a range of 180 degrees ±90 degrees.

4 Claims, 7 Drawing Sheets

Freq (100.0MHz to 6.000GHz)

Freq (100.0MHz to 6.000GHz)

ELECTRONIC APPARATUS AND DESIGN METHOD

BACKGROUND OF THE INVENTION

This invention relates to a wireless communication system technique for transmission of a fundamental wave of a transmission signal with a low loss suppressing the higher harmonic wave to a level lower than a predetermined level, and more particularly relates to a technique that is to be effectively used, for example, for a front end module of a multi-band type cellular phone.

A built-in system of a cellular phone is provided with an LSI having a microcomputer, memory, and high-frequency circuit for modulation/demodulation of signal and electronic apparatus called as a module on which a plurality of IC such as transistor element, capacitance element, and inductance element are mounted on an insulating substrate formed of ceramic, which LSI and module are mounted on a printed circuit, and the effort has been made to reduce the number of electronic apparatus for intensifying the packaging density. For example, a module on which a transmission power amplifier and an impedance matching circuit are mounted and a module on which a transmission/reception switching circuit and a diplexer are mounted have been used practically as the module used for a dual-band type cellular phone system, and the front end section mainly comprises these two modules.

In the present patent specification, an integrated component on which a plurality of electronic apparatuses are mounted on an insulating substrate such as ceramic substrate having printed wiring on the surface and inside thereof and in which electronic apparatuses are connected by means of the printed wiring and bonding wire so as to function as desired is called as module because such integrated component can be regarded as one single electronic apparatus because of the function thereof.

SUMMARY OF THE INVENTION

The cellular phone is required to made small-sized and light-weight. It is important to reduce the number of electronic apparatus and intensify the packaging density of a substrate to satisfy the above-mentioned requirement. The inventors of the present invention tried to combine the above-mentioned two modules, which have been mounted separately, into one module.

In a cellular phone system, though the impedance of a transmission/reception antenna terminal is regulated to be 50 $\Omega$, an impedance matching circuit (simply referred to as matching circuit hereinafter) is interposed between a transmission power amplifier and an antenna terminal because an output impedance of the transmission power amplifier is far lower than 50 $\Omega$. On the other hand, it is required for a transmission path from the transmission power amplifier to the antenna terminal that the transmission loss of the fundamental wave is small and the higher harmonic wave having frequencies that are integer multiple of the fundamental frequency should be reduced sufficiently.

For example, Japanese Published Unexamined Patent Application No. Hei 11(1999)-234062 discloses a technique in which a resonance circuit formed by connecting an inductance element and a capacitance element in parallel is provided between an output power amplifier and a matching circuit so that the resonance point of the resonance circuit is brought into coincidence with the frequency of the higher harmonic wave to thereby attenuate the higher harmonic component as a technique for reducing the higher harmonic wave in the transmission system of a cellular phone. As an another technique, a technique in which a low-pass filter, which is used to attenuate the higher harmonic wave, is provided at the rear end of a matching circuit, namely between the matching circuit and a transmission/reception switching circuit, has been proposed.

It is desirable that the low-pass filter is disposed at the rear end of the matching circuit to reduce the higher harmonic wave with consideration of jumping of the higher harmonic wave in the matching circuit. Based on the above, the inventors of the present invention decided to employ the system in which a low-pass filter including a resonance circuit was provided at the rear end of a matching circuit for development of the one combined module having an output power amplifier, a matching circuit, a low-pass filter, and a transmission/reception switching circuit.

The double higher harmonic wave is highest, the triple higher harmonic wave is second higher, and four-times higher harmonic wave is next higher, and the higher the order of the higher harmonic wave, the more the intensity of the harmonic wave decreases in the case of the high order harmonic wave arising from the fundamental wave supplied from the output power amplifier. Therefore, it is most important to reduce the double higher harmonic wave to shut off the higher harmonic wave.

For example, in the case of the dual-band cellular phone of GSM (Global System for Mobile Communication) and DCS (Digital Cellular System), it is standardized that the double higher harmonic wave level in the band ranging from 1760 to 1804 MHz is equal to or lower than −30 dBm for 900 MHz fundamental wave GSM transmission and the double higher harmonic wave level in the band ranging from 1805 to 1830 MHz is equal to or lower than −36 dBm. Particularly, because the fundamental frequency of DCS is 1.8 GHz, the condition near 1800 MHz is limited severely as described hereinabove in order to prevent jumping of noise from GSM transmission side to DCS reception side.

FIG. 3A shows a general example of a low-pass filter circuit including a resonance circuit comprising an inductance element L0 and a capacitance element C0 that is capable of transmitting the signal with a low loss. The capacitance elements C1 and C2 are served for transmitting the signal to match with the impedance at a low loss. The resonance point of the low-pass filter that includes such resonance circuit is brought into coincidence with the frequency of the double higher harmonic wave of the fundamental wave to thereby reduce the double higher harmonic wave sufficiently. It was found that the low-pass filter itself can be used to reduce the double higher harmonic wave to a desired level or lower (for example, −30 dB) actually for the case in which a low-pass filter was incorporated in a module. However, it was found that the double higher harmonic wave could not be reduced to the level of −30 dB or lower for the case in which an output power amplifier, a matching circuit, a low-pass filter, and a transmission/reception switching circuit were incorporated in a module as the whole.

It is the object of the present invention to provide a module used for a wireless communication system comprising at least an output power amplifier, a matching circuit, and a low-pass filter that is capable of transmitting the fundamental wave with a low loss and capable of reducing the double higher harmonic wave to a desired level or lower as the whole module in the case that the low-pass filter comprising a resonance circuit is provided at the rear end of the matching circuit.

The above-mentioned and other objects and characteristics will be apparent from the detailed description of the present patent specification and attached drawings.

The outline of representative inventions disclosed in the present patent application will be described herein under.

In detail, the present invention provides an electronic apparatus to be used for a wireless communication system in which at least an output power amplifier, a matching circuit, and a low-pass filter are mounted on one insulating substrate and connected in the above-mentioned order, wherein the phase of the double higher harmonic wave impedance in view of the low-pass filter side from the connection point between the matching circuit and the low-pass filter is set in a range of 180 degrees ±90 degrees with respect to the phase of the double higher harmonic wave impedance in view of the matching circuit from the above-mentioned connection point.

According to the above-mentioned means, because the phase of the double higher harmonic wave impedance is rotated (changed) to the mismatching position by means of the low pass-filter, the double higher harmonic wave component of the fundamental wave can be reduced to a desired value or lower while the transmission loss of the fundamental wave is being suppressed without insertion of a transmission line path having a desired length between the matching circuit and the low-pass filter.

Furthermore, a transmission/reception switching circuit and a branching circuit for branching a received signal including a plurality of frequency bands may be mounted on the front end module in addition to the output power amplifier, the matching circuit, and the low-pass filter.

Furthermore, a low pass-filter comprising a resonance circuit having an inductance element and a capacitance element connected in parallel and a capacitance element to be connected between the input point and output point of the resonance circuit and a constant potential point for reducing loss of the fundamental wave and impedance matching, namely a low-pass filter which do not have the input point side capacitance element but has only output point side capacitance element, is preferably used as the above-mentioned low-pass filter.

The above-mentioned matching circuit preferably includes a resonance circuit having a capacitance element and a inductance element connected in parallel. Accordingly, the double higher harmonic wave component is attenuated in the matching circuit and is further attenuated by the low-pass filter, whereby the level can be further reduced to be low.

Furthermore, for designing the above-mentioned module in which at least an output power amplifier, a matching circuit, and a low-pass filter are mounted on one insulating substrate and connected in the above-mentioned order, it is preferable to set the phase of the double higher harmonic wave impedance in view of the low-pass filter side from the connection point between the matching circuit and the low-pass filter in a range of 180 degrees ±X (X ranges within 90 degrees) with respect to the phase of the double higher harmonic wave impedance in view of the matching circuit from the above-mentioned connection point, and it is preferable to determine the X based on a value of the standard value added with a predetermined margin.

As the result, the module that is capable of attenuating the double higher harmonic wave as a whole can be obtained through a filter circuit that is not so capable of attenuating the double higher harmonic wave is used, and designing is made easily and the manufacturing process condition is rendered not restrictive. In other words, if a desired attenuation is desired to be attained only by devising the filter, a serious load is loaded on a designer who is to develop the filter having such excellent characteristic or the manufacturing process condition is rendered restrictive. However, in the present invention, because the double higher harmonic wave is further attenuated by rotating the phase by means of the filter, the filter can be designed easily and the manufacturing process condition is rendered not restrictive.

DETAILED DESCRIPTION OF THE PREFERRED EMBODIMENTS

Preferred embodiments of the present invention will be described in detail hereinafter with reference to the drawings.

During the development of incorporation of an output power amplifier, a matching circuit, a low-pass filter, and a transmission/reception switching circuit into one module, the inventors of the present invention found that, though a low-pass filter itself could reduce the double higher harmonic wave to a desired level or lower in the case that the low-pass filter including a resonance circuit was used, the double higher harmonic wave could not be reduced to the desired level or lower as the whole module.

Figure 6:
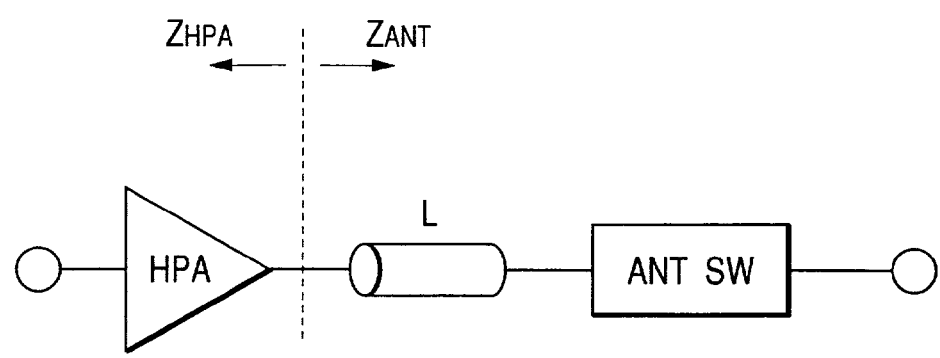
FIG. 6 is a conceptual diagram showing a system that is structured to study the relation between the length of a cable used for connecting a power amplifier to an antenna selective switch and the double higher harmonic wave level.

In the early stage, the inventors of the present invention attributed the reason to aerial propagation jumping of the higher harmonic wave from the output power amplifier to the transmission/reception switching circuit side. Then, a transmission wire path (50 Ω, semirigid cable: referred to as cable hereinafter) L having a desired length was interpolated between the power amplifier HPA that included the matching circuit and the antenna selector switch ANTSW as shown in FIG. 6, and the double higher harmonic wave level of the whole system shown in FIG. 6 was measured with changing the length of the cable L.

Figure 7:
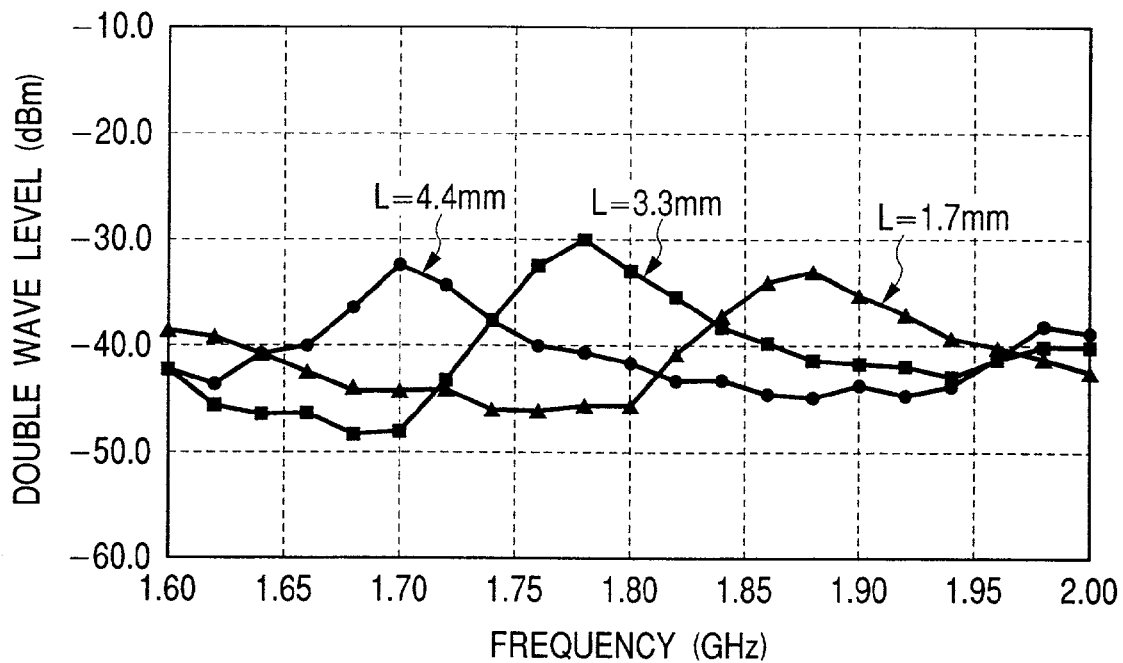
FIG. 7 is a graph showing the relation between the double higher harmonic wave level and the frequency with changing the length of the cable in the system shown in FIG. 6.

The result is shown in FIG. 7. It was found from FIG. 7 that the double higher harmonic wave level was not proportional to the length of the cable and changed periodically though the level changed depending on the length of the cable. Based on the abovementioned fact, it was presumed that the double higher harmonic wave reduction effect due to interpolation of the cable was not dependent on the aerial propagation of the double higher harmonic wave but dependent on a certain phase relation between the output power amplifier and the transmission/reception switching circuit. To quantify the relation between the cable length and the phase and the periodicity, the variation of the cable length was converted into the phase variation of the double wave impedance.

Figure 8:
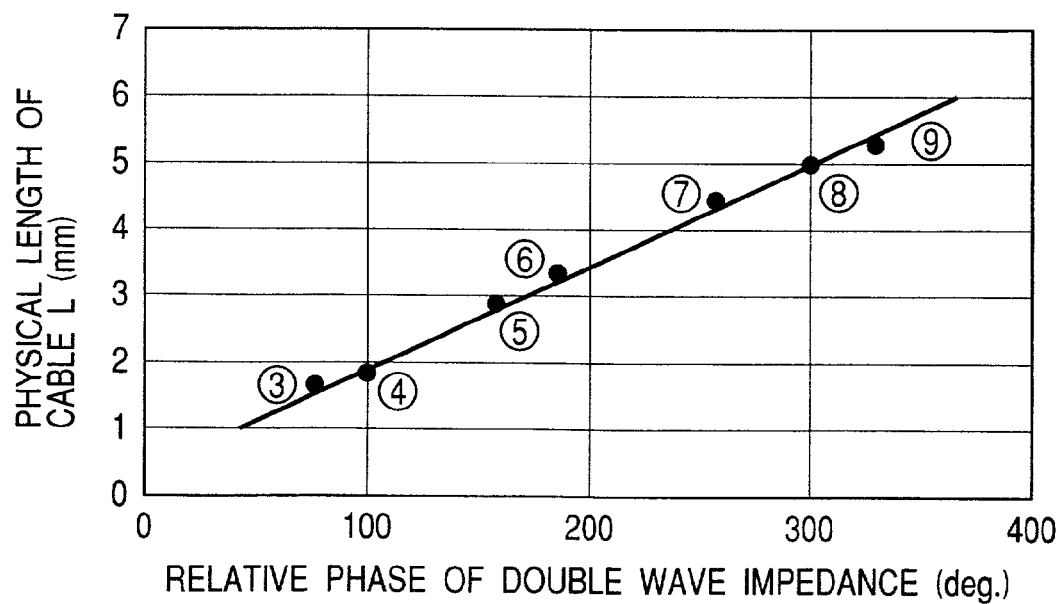
FIG. 8 is a graph showing the relation between the cable length and the relative phase of the double higher harmonic wave impedance in the system shown in FIG. 6.

In detail, the double wave impedance ZANT was measured in view of the cable side from the connection between the matching circuit and the cable to thereby reveal the relative phase relation between the cable length and the double wave impedance. The result is shown in FIG. 8. From FIG. 8, the correlation between the cable length and relative phase of the double impedance is found clearly.

Based on the above-mentioned correlation, the double wave impedance ZANT and the double higher harmonic wave level were measured for the 1830 MHz frequency signal with changing the cable length. The result is shown in FIG. 9 and FIG. 10.

Figure 9:
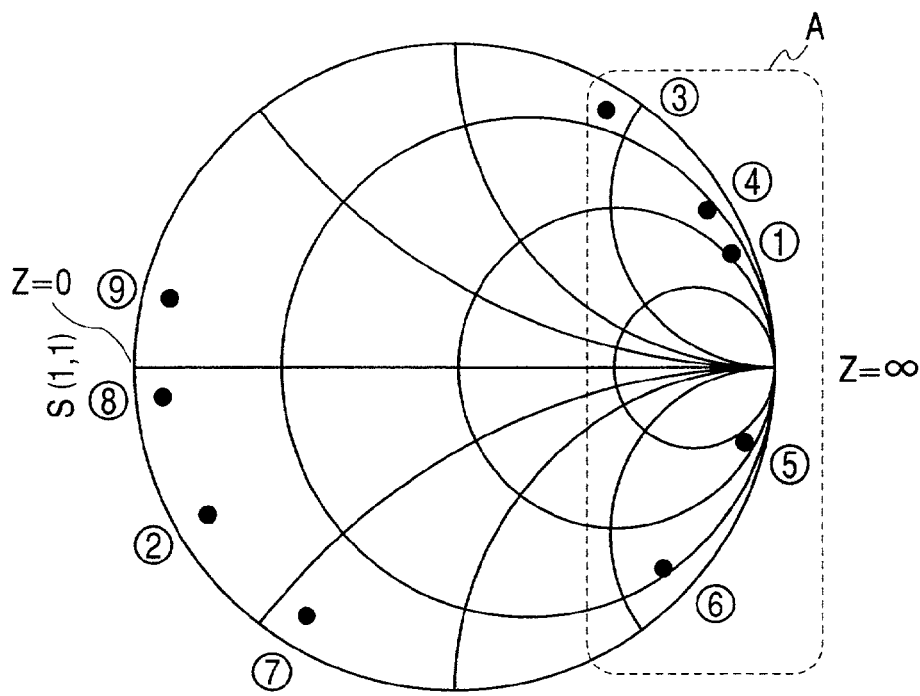
FIG. 9 is an explanatory diagram showing the phase of the double higher harmonic wave impedance ZANT corresponding to the cable length in view of the antenna switch side from the connection point between the power amplifier and the cable, which is shown in the form of Smith chart.
Figure 10:
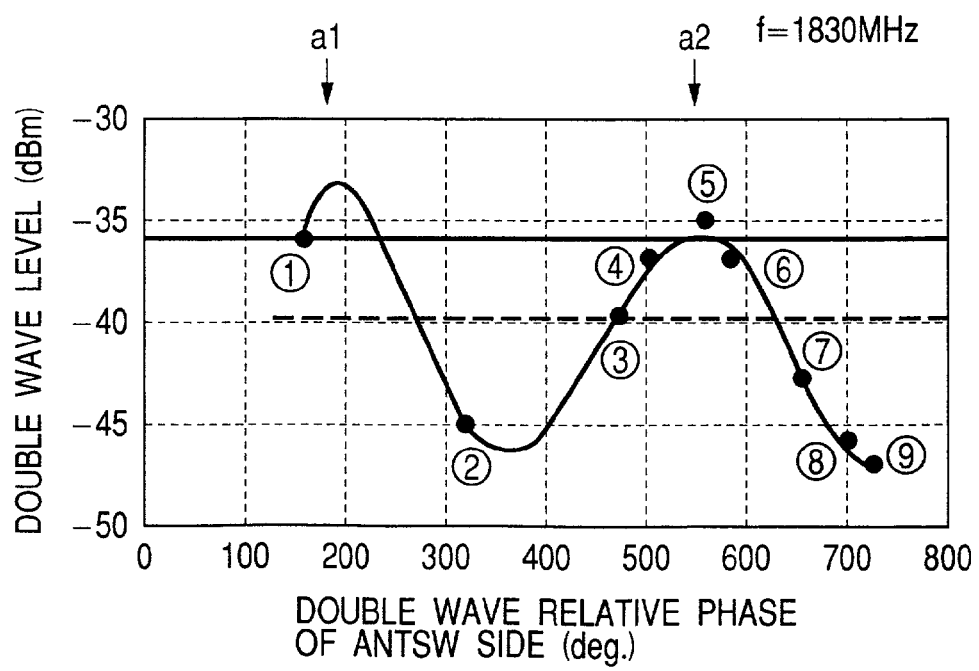
FIG. 10 is a graph showing the relation between the relative phase from the base point "0" of respective points (1) to (9) shown in FIG. 9 and the double higher harmonic wave level.

FIG. 9 is a diagram formed by plotting the respective double wave impedances ZANT on a Smith chart phase clockwise having the short point (Z=0) that is regarded as the reference point (phase=0), and FIG. 10 is a diagram for showing the relation between the relative phase from the reference point "0" of the respective points (1) to (9) shown in FIG. 9 and the double higher harmonic wave level. In FIG. 9 and FIG. 10, (1) represents the relative phase caused at the connector on the starting end side of the cable, and (2) represent the relative phase caused at the connector on the terminal end side of the cable. From FIG. 10, it is found that the double higher harmonic wave level changes periodically with respect to the relative phase of the double wave impedance.

In the standard of dual-band type GSM and DCS, it is specified that the double wave level in the band ranging from 1805 to 1830 MHz should be −36 dBm or lower. Therefore, it is found from FIG. 10 that (2) to (4) and (6) to (9) excepting (1) and (5) satisfy requirement of the standard. Furthermore, in the case that the condition of the double wave level of −40 dBm or lower is employed in consideration of a margin of about 10%, (2) and (7) to (9) satisfy requirement of the standard, and (1) and (3) to (6) do not satisfy requirement of the standard. In FIG. 9, the phase region enclosed by a broken line A does not satisfy the condition.

Next, it is found that the phase of the double wave impedance ZHPA in view of the matching circuit side from the connection point between the matching circuit and the cable is approximately 200 degrees. This is shown in FIG. 10 as the relative position of the characters a1 and a2. From the above-mentioned result, it is found that the double higher harmonic wave level is maximized at the point where the phase of the double wave impedance ZANT in view of the cable side from the connection point between the matching circuit and the cable coincides with the phase of the double wave impedance ZHPA in view of the matching circuit side, and on the other hand the double higher harmonic wave level is minimized at the position where the one phase deviates from the other phase by 180 degrees.

Figure 11:
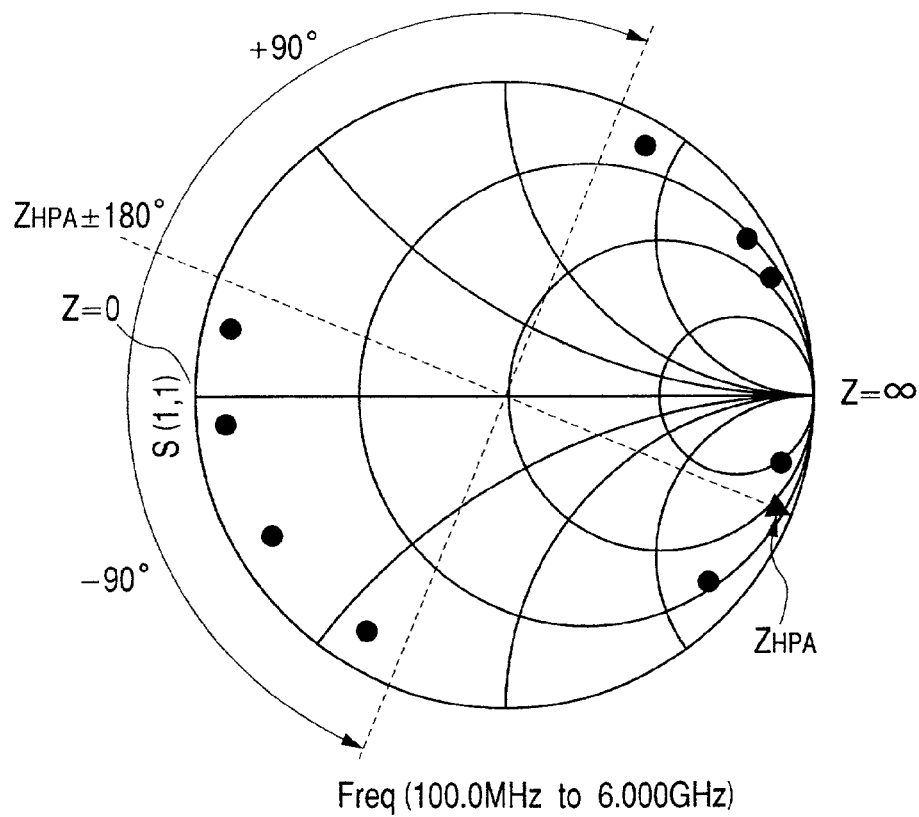
FIG. 11 is an explanatory diagram showing the relation between the phase of the double higher harmonic wave impedance ZANT corresponding to the cable length in view of the antenna switch side from the connection point between the power amplifier and the cable and the phase of double higher harmonic wave impedance ZHPA in view of the power amplifier side from the connection point between the power amplifier and the cable, which is shown in the form of Smith chart.

On the other hand, the double wave impedance ZHPA in view of the matching circuit side from the connection point between the matching circuit and the cable is plotted on a Smith chart together with the respective points (1) to (9) to obtain a position shown with a mark ▲ in FIG. 11. It is found that the phase included in a range from 90 degrees to 180 degrees from the phase of ZHPA satisfies the above-mentioned condition "the double wave level of −40 dBm or lower" out of the above-mentioned phases in the case that this point is employed as the reference.

Herein, based on the fact that the double wave level is optimal at the position where the phase deviates 180 degrees from the phase of ZHPA, it is estimated that the phase range from 180 degrees to 270 degrees also satisfies the condition "the double wave level of −40 dBm or lower" though it is not plotted in FIG. 11. In other words, the length of the cable is designed so that the double wave impedance ZANT is included in the range of 180 degrees ±90 degrees from the phase of ZHPA to thereby satisfy the condition.

The range of 180 degrees ±90 degrees is the condition to reduce the double wave level to −40 dBm or lower, and the range changes depending on the upper limit. For example, in the case that the level is set to −45 dBm or lower to have a margin of 25%, it is found that the range is narrowed to 180 degrees ±45 degrees in this case because only the points (8) and (9) satisfy the condition in FIG. 10.

However, when a test was carried out by use of a ceramic substrate having a relative dielectric constant approximately similar to (9) provided with the cable to satisfy the above-mentioned phase relation, it was found that the cable length of ten and several mm was required to satisfy the above-mentioned phase relation and the so long cable caused a trouble to miniaturize the module when an output power amplifier, a matching circuit, a low-pass filter, and a transmission/reception switching circuit were incorporated together to form one module. To avoid the trouble, it was tried to adjust the phase of a low-pass filter, and such low-pass filter type was studied. As the result, it was found that a module that was capable of transmitting the fundamental wave with a low loss with reduced double higher harmonic wave to a level equal to or lower than the standard level could be realized by use of a low-pass filter as shown in FIG. 3B. As the result, the present invention has been accomplished.

Figure 3A:
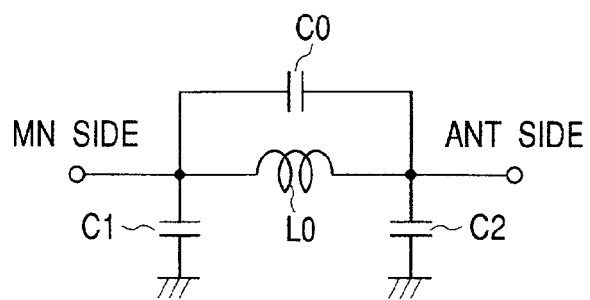
FIG. 3A is a circuit diagram showing a general exemplary circuit of a low-pass filter including a resonance circuit.
Figure 3B:
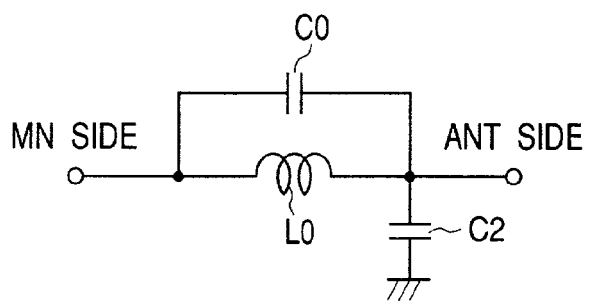
FIG. 3B shows a circuit diagram showing an exemplary circuit of a low-pass filter used for a module to which the present invention is applied.

Though it is possible to rotate the phase of the double wave impedance by changing the constant of an inductance and capacitance with using the low-pass filter of the circuit type shown in FIG. 3A, this method is not preferable because the attenuation of the double wave arising from the filter itself becomes poor.

Figure 1:
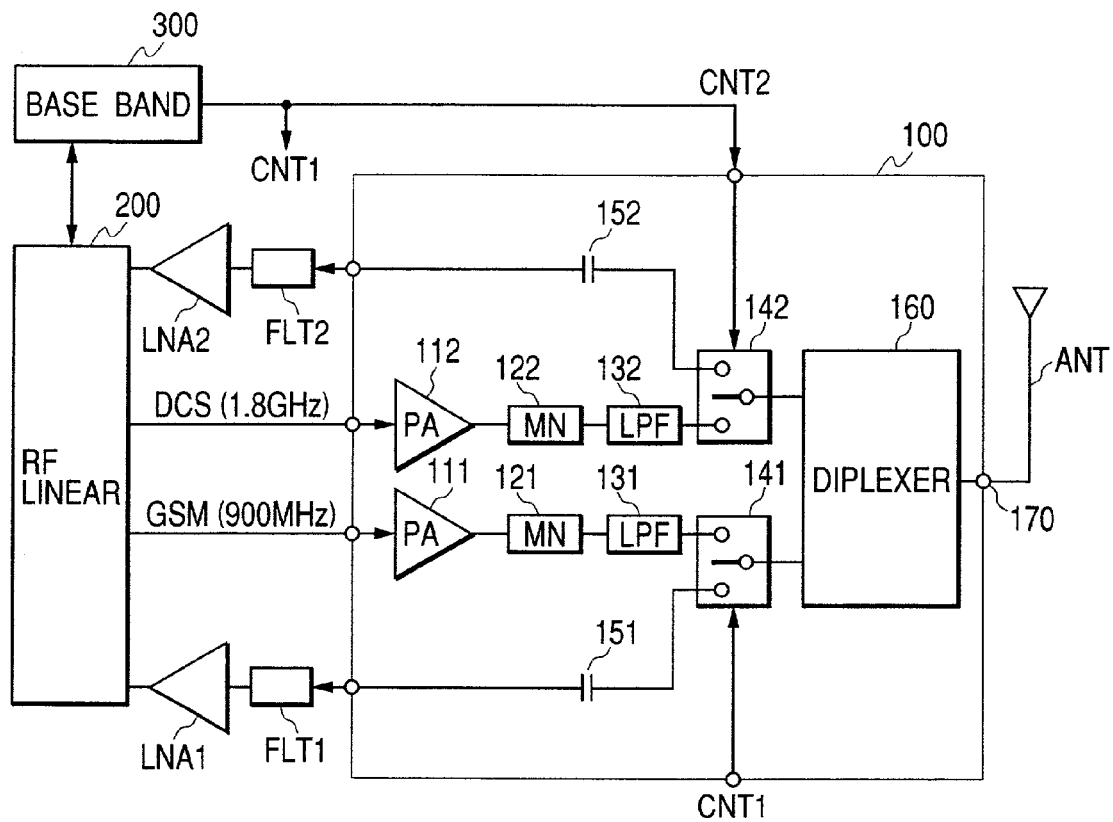
FIG. 1 is a block diagram showing an example of a front end that is suitably used for a dual-band cellular phone capable of transmission/reception in two systems, namely GSM and DCS.

FIG. 1 shows one exemplary front end suitably used for a dual-band type cellular phone that is capable of two types of transmission/reception, namely GSP and DCS.

In FIG. 1, ANT denotes a transmission/reception antenna for transmitting/receiving signal wireless wave, 100 denotes a front end module to which the present invention is applied, 200 denotes a high frequency processing circuit for down-converting and demodulating the frequency of a received signal to an intermediate frequency to thereby generate a base band signal and for modulating a received signal, 300 denotes a base band circuit for converting an audio signal to a base band signal and for converting a received signal to an audio signal, FLT1 and FLT2 denote filters for removing noise from a received signal, and LNA1 and LNA2 denote low-noise amplifiers for amplifying a received signal.

For example, the filter FLT1 and the amplifier LNA1 are served for a GSM circuit, and the filter FLT2 and LNA2 are served for a DCS circuit. The high frequency processing circuit 200 comprises one or more semiconductor integrated circuits. The base band circuit 300 comprises a plurality of LSI and IC such as DSP (Digital Signal Processor), micro-processor, and semiconductor memory.

The front end module 100 comprises output power amplifier 111 and 112 for amplifying a signal received from the high frequency processing circuit 200, impedance matching circuits 121 and 122, low-pass filters 131 and 132 for attenuating the higher harmonic wave, transmission/reception switching circuits 141 and 142, capacitances 151 and 152 for cutting the DC component from a received signal, a diplexer 160 for branching a signal into a GSM type signal of 900 MHz band and a DCS type signal of 1.8 GHz band. These circuits and elements are mounted on one ceramic substrate to form a module.

The module used in the present example is provided with a terminal 170 that is designed to have an impedance of 50 Ω to which the transmission/reception antenna ANT is connected. The impedance of the connection point between the impedance matching circuits 121 and 122 and the low-pass filters 131 and 132 for attenuating the higher harmonic wave and the impedance of the connection point between the low-pass filters 131 and 132 and the transmission/reception switching circuits 141 and 142 are also designed to have an impedance of 50 Ω respectively.

Furthermore, though it should be limited not necessarily, in the present example, the transmission/reception switching circuits 141 and 142 are switched in response to switching control signals CNT1 and CNT2 supplied from the base band circuit 300.

Figure 2:
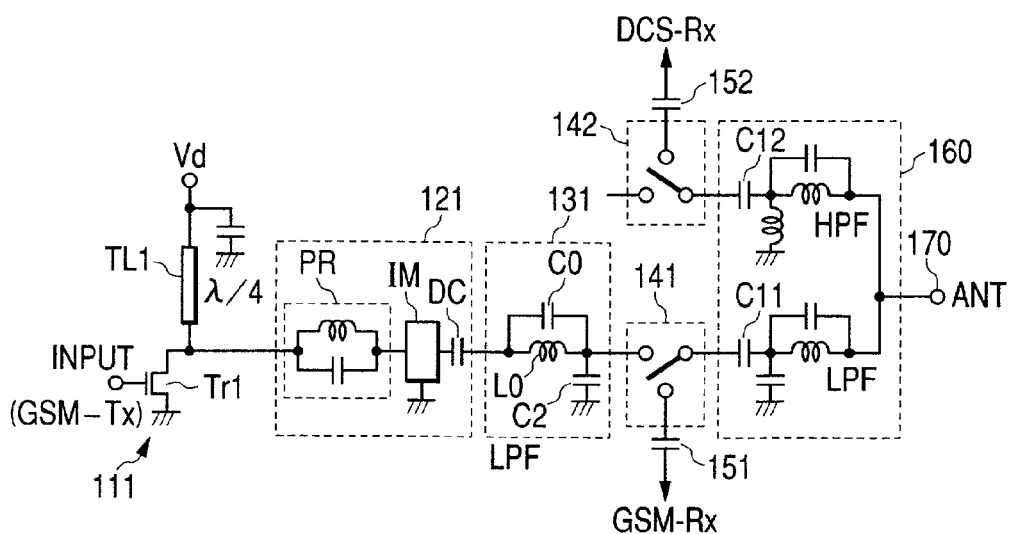
FIG. 2 is a circuit diagram showing a detailed exemplary circuit structure of one transmission section (for example, GSM) of the front end module shown in FIG. 1.

FIG. 2 shows a detailed exemplary circuit of one transmission section (for example, GSM) of the front end module 100 shown in FIG. 1.

In FIG. 2, Tr1 is the final end transistor of the output power amplifier 111, a transmission signal is supplied to the gate terminal of the transistor Tr1, a power voltage Vd is applied on the drain terminal through $\lambda/4$ transmission line path TL1 having an electric length of $\frac{1}{4}$ wavelength of the fundamental wave, and the impedance matching circuit 121 is connected to the connection node between the $\lambda/4$ transmission line path TL1 and the drain terminal of the transistor Tr1. In the above, the TL1 is not necessarily a $\frac{1}{4}$ line path but may be a coil inductance.

Though it is limited not necessarily, in the present example, the impedance matching circuit 121 is provided with a parallel resonance circuit PR having an inductance element and a capacitance element, a matching means IM comprising a transmission line path and a capacitance element, and a capacitance element DC for cutting DC noise that comes from the low-pass filter 131 side to the power amplifier side. The constant of the circuit is set so that the impedance of the output node of the impedance matching circuit 121 is 50 Ω. MOSFET is used as the output transistor Tr1 in FIG. 1, but the output transistor is not limited to MOSFET, and a bipolar transistor, GaAsMESFET, hetero-connection bipolar transistor (HBT), or HEMT (high-electron-mobility transistor) may be used instead.

The impedance of the input terminal and output terminal of the transmission/reception switching circuit 141 is 50 Ω, though it is desirable that a switching circuit that does not change the phase of the impedance in the view from the low-pass filter 131 side is used, a designer can design a switching circuit having such characteristic generally, and such characteristic can be realized by use of a switching circuit that is used for a conventional antenna switching circuit module of an cellular phone. Therefore the detailed description will be omitted.

The diplexer 160 comprises the low-pass filter LPF having a parallel resonance circuit, a capacitance element connected between the node located opposite to the antenna terminal 170 of the parallel resonance circuit and the earth potential point, and a DCS cutoff capacitance element C11 disposed between the resonance circuit and the transmission/reception switching circuit 141 and the high-pass filter HPF having a parallel resonance circuit, an inductance element connected between the node located opposite to the antenna terminal 170 of the parallel resonance circuit and the earth potential point, and a DC cutoff capacitance element C12.

The low-pass filter 131 comprises a parallel resonance circuit having an inductance element L0 and a capacitance element C0 and a capacitance element C2 connected between the output point of the resonance circuit and the earth potential point for reduction of loss of the fundamental wave and impedance matching. By using the low-pass filter of this type, the phase of the double wave impedance is rotated to a desired position to thereby reduced the double higher harmonic wave level to −40 dBm or lower. The characteristic of this filter will be described in detail herein under.

Figure 4A:
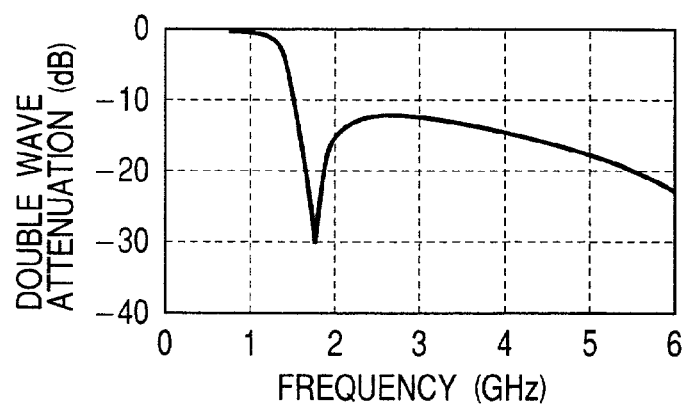
FIG. 4A is a graph showing the double wave attenuation characteristic of the low-pass filter shown in FIG. 3A.
Figure 4B:
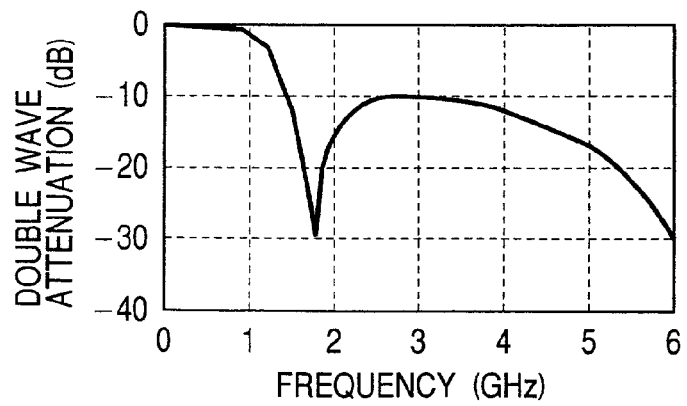
FIG. 4B is a graph showing the double wave attenuation characteristic of the low-pass filter shown in FIG. 3B.

A usual low-pass filter comprising a resonance circuit formed by connecting an inductance element L0 and a capacitance element C0 in parallel, a capacitance element C1 connected between the input point of the resonance circuit and the earth potential point, and a capacitance element C2 connected between the output point of the resonance circuit and the earth potential point as shown in FIG. 3A. Both the capacitance elements are served for reduction of loss of the fundamental wave and impedance matching. The double wave attenuation characteristic of such low-pass filter is shown in FIG. 4A. Furthermore, the low-pass filter shown in FIG. 3B has no capacitance C1 to be located on the input terminal side, which is provided in the case of the circuit shown in FIG. 3A. The double wave attenuation characteristic of the low-pass filter of FIG. 3B is shown in FIG. 4B. It is apparent from comparison between FIG. 4A and FIG. 4B that both the filters themselves can attenuate the double higher harmonic wave approximately in the same extent.

Figure 5:
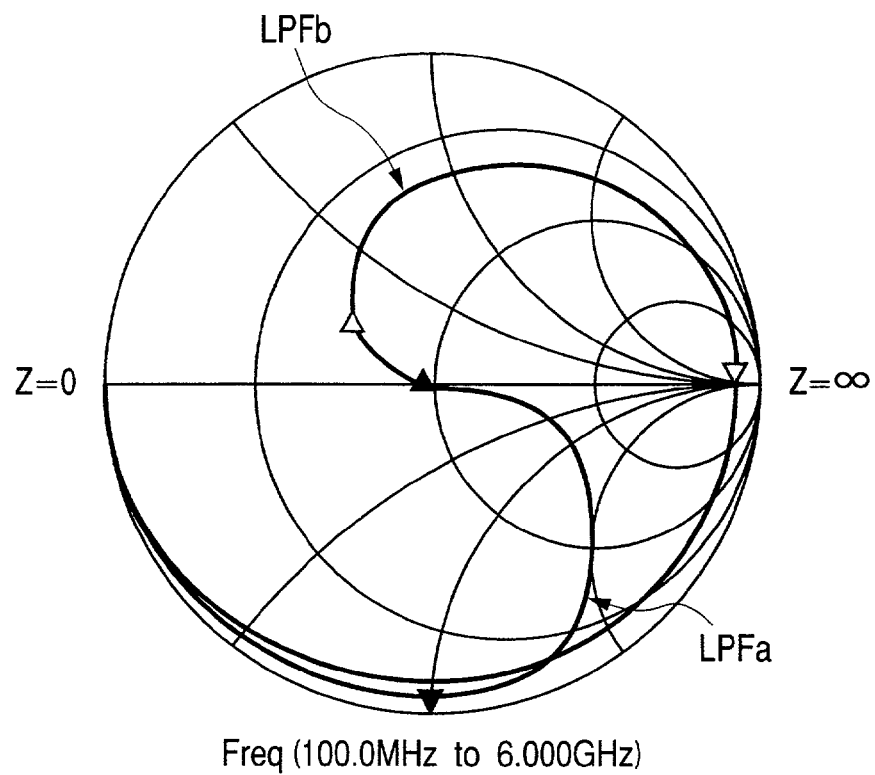
FIG. 5 is a Smith chart showing the phase characteristic of the filter shown in FIG. 3A and FIG. 3B.

On the other hand, FIG. 5 shows the phase characteristic of these filters shown in FIG. 3A and FIG. 3B in the form of Smith chart. In FIG. 5, LPFa shows the phase characteristic of the filter shown in FIG. 3A, and LPFb shows the phase characteristic of the filter shown in FIG. 3B respectively. A mark ▼ shows the phase position of the double wave (1.8 GHz) impedance for the filter shown in FIG. 3A, and a mark ∇ shows the phase position of the double wave impedance for the filter shown in FIG. 3B.

From FIG. 5, it is apparent that the filter shown in FIG. 3B can rotate the double wave impedance phase of the filter shown in FIG. 3A by approximately 90 degrees more. Thereby, the filter circuit is designed so as not to phase-match with the double higher harmonic wave intentionally, and the double higher harmonic wave can be reduced during passage through the filter.

As described in SUMMARY OF THE INVENTION, the module in which the usual low-pass filter as shown in FIG. 3A connected at the rear end of the matching circuit is used is insufficient to reduce the double higher harmonic wave level to −30 dBm or lower, but the module described in the example shown in FIG. 1 in which the filter shown in FIG. 3A is used can rotate the double wave impedance phase by approximately 90 degrees more to thereby reduce the double higher harmonic wave level to −30 dBm or lower.

The impedance phase of the fundamental wave (900 MHz) of the filter shown in FIG. 3A is positioned at the center (the point indicates no loss with 50 Ω) as shown with the mark ▲ in Smith chart shown in FIG. 5. On the other hand, the impedance phase of the fundamental wave of the filter shown in FIG. 3B is positioned at the mark △ shown in Smith chart shown in FIG. 5. Because both the filters shown in FIG. 3A and in FIG. 3B cause scarce insertion loss of the fundamental wave inherently, the attenuation action due to phase mismatching of the impedance is negligibly small.

Because the filter shown in FIG. 3B has no capacitance C1 though the filter shown in FIG. 3A has both capacitances C1 and C2 served for loss reduction, the transmission loss in the case of the filter shown in FIG. 3B is slightly larger than that in the case of the low-pass filter shown in FIG. 3A as it is apparent in comparison between FIG. 4A and FIG. 4B. However, because the increment is relatively small, the total performance of the module of the present example is regarded to be better than that of the comparative module in consideration of the advantage that the double higher harmonic wave level is reduced to −30 dBm or lower despite the reduction of transmission loss. Accordingly, the filter of circuit type shown in FIG. 3B is employed.

In the case of the conventional front end comprising two modules, the double higher harmonic wave is reduced by changing the layout of the two modules to change the length of the transmission line path (wiring) for connecting between the modules. However, in this case, because the layout of the modules is designed relying upon intuition of a designer and there is no effective means for designing the layout of the modules correctly, the length of the transmission line path is too long inevitably and the long transmission line path prevents the system from being miniaturized.

On the other hand, the module can be miniaturized by applying the present example easily, and the double higher harmonic wave is reduced reliably. The change of the layout of the two modules of the conventional front end comprising the two modules means the change of the length of the transmission line path (wiring) for connecting between the modules, and the change of the length of the transmission line path results in the rotation of the impedance phase as in the case of the filter circuit of the present example. However, the conventional design does not involve the active intention to rotate the impedance phase by changing the transmission line path (wiring). The reason is that the length of the transmission line can be designed not based on experience but based on calculation if the transmission line path is changed with active intention.

Figure 12:
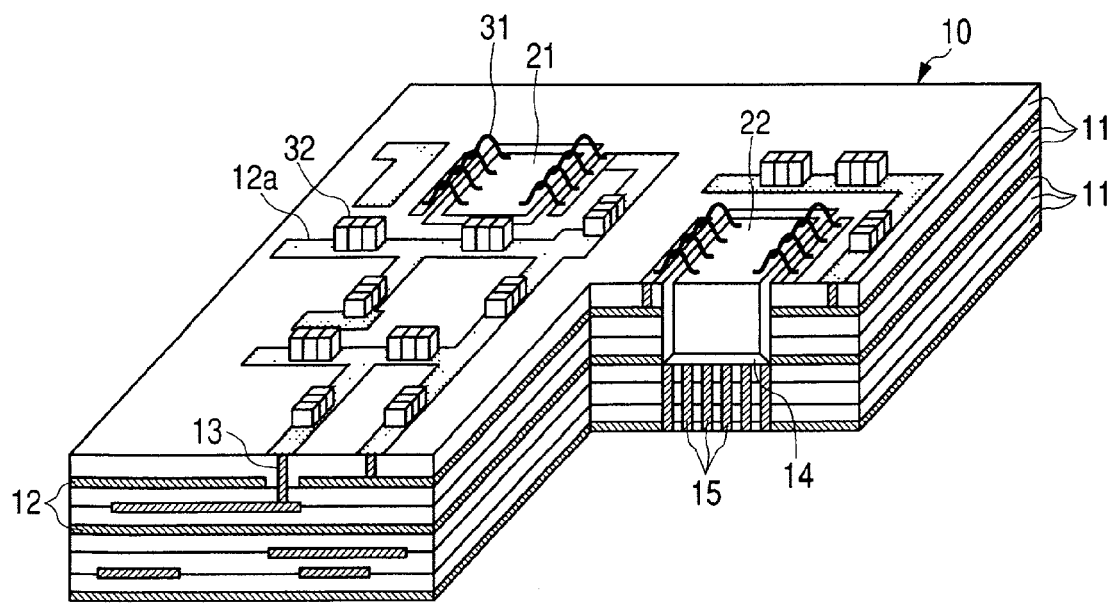
FIG. 12 is partial cross sectional perspective view showing a device structure in which the circuit shown in FIG. 1 is incorporated to form a module.

FIG. 12 shows a device structure in which the circuit shown in FIG. 1 is incorporated in the form of a module. FIG. 12 is a diagram that does not shows the structure of the front end module of the present example correctly, but shows the structural diagram from which the detail is omitted to show the outline.

As shown in FIG. 12, the body 10 of the module of the present example comprises a plurality of dielectric plates 11 such as ceramic plate consisting of alumina combined into one piece. On the front surface and back surface of each dielectric plate 11, a conductive layer 12 consisting of conductive material such as copper plated with gold on which a desired pattern is formed is provided. 12a denotes a wiring pattern comprising a conductive layer 12. Furthermore, a hole 12 called as a though hole is formed on each dielectric plate 11 to connect between conductive layer 12 or wiring pattern together on the front and back surfaces of each dielectric plate 11, and conductive material is filled in the hole.

In the case of the exemplary module shown in FIG. 12, six dielectric plates 11 are laminated, conductive layers 12 are formed on the almost entire surface of the back side of the first layer, third layer, and sixth layer from the top, which are served as the ground layer for supplying the earth potential GND respectively. Conductive layers 12 provided on the front and back surfaces of other dielectric plates 11 are served for the transmission line path. The width of the conductive layers 12 and the thickness of the dielectric plates 11 are designed so that the impedance of the transmission line path is adjusted to be 50 Ω.

A rectangular hole is formed on the first to third dielectric plates 11 to dispose GSP system power amplifier IC21 and DCS system power amplifier IC22. Each IC is inserted into the inside of the hole and fixed on the bottom of the hole with binder 14. Holes 15 called as via hole are formed on the fourth dielectric plate 11 located at the position corresponding to the bottom of the hole and on dielectric plates 11 laminated under the fourth dielectric plate 11, and conductive material is filled in the holes. The conductive material filled in the via holes is served to transfer the heat generated from the IC21 and IC22 to the lowermost conductive layer to dissipate the heat and improve the thermal efficiency.

Electrodes on the top surface of the IC21 and IC22 and the predetermined wiring pattern 12a are connected electrically by means of bonding wire 31. Furthermore, on the surface of the first layer dielectric plate 11, a plurality of chip-type electronic apparatuses 32 such as capacitances, resistive elements, inductances are mounted to form the above-mentioned matching circuit 121 and filter circuit 131. Otherwise, these elements may be formed in the internal of the substrate by use of conductive layers on the front and back surfaces of dielectric plates 11 instead of use of the electronic apparatus.

Figure 13:
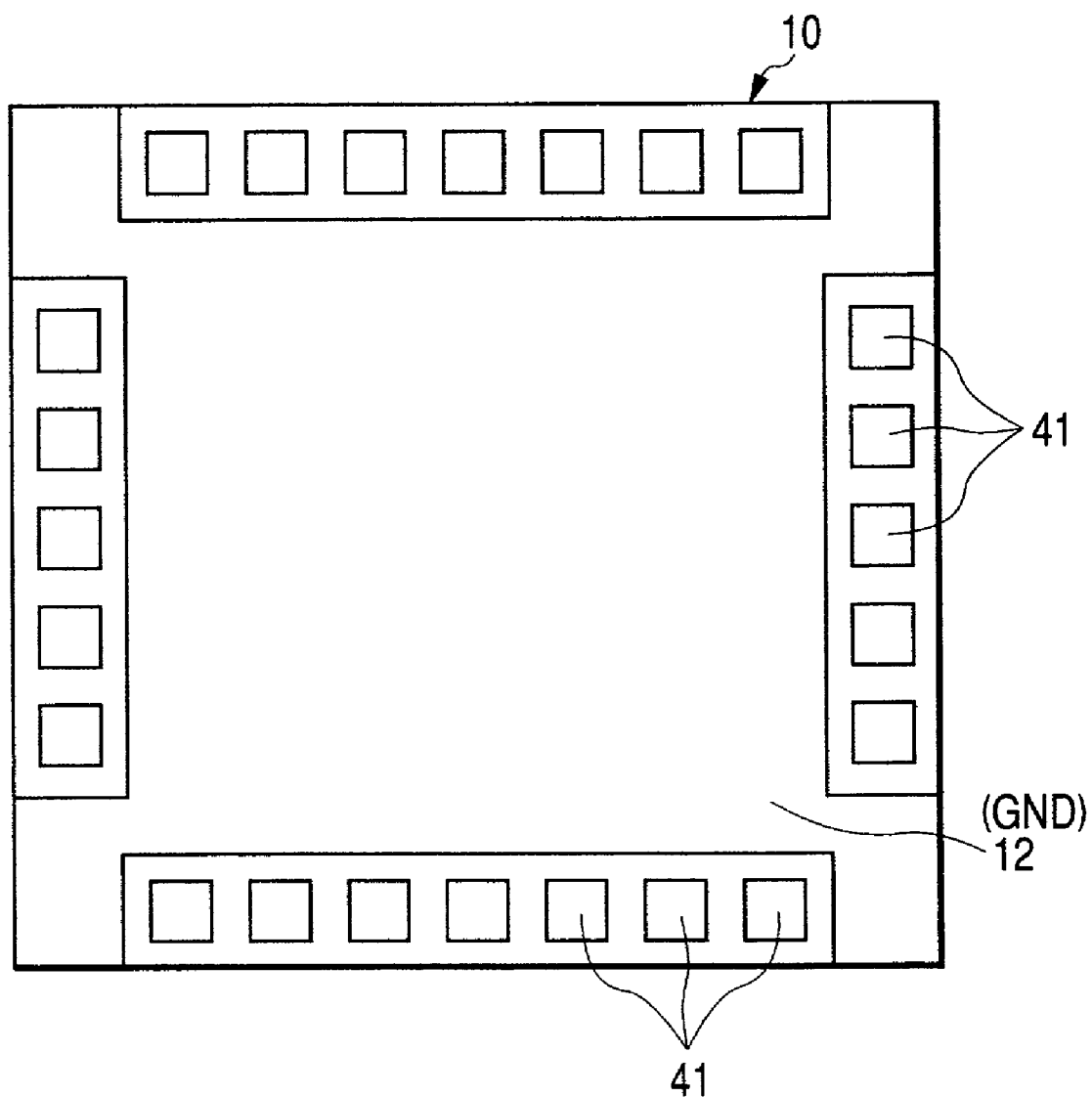
FIG. 13 is a bottom view showing an exemplary structure of the back side of a module of an example.

The module has an external terminal served for mounting the module of the present example on a printed wiring board by connecting electrically each other. The external terminal is an electrode pad 41 comprising a conductive layer that is formed in a predetermined shape, and the external terminal is disposed on the back surface of the module body 10 as shown in FIG. 13. The external terminal is structured so as to be mounted on the printed wiring board with interposition of a solder ball between the electrode pad and the corresponding portion located on the printed wiring board of the system (a portion of the wiring or conductive layer connected to the wiring).

The layout and the configuration of the electrode pad 41 shown in FIG. 13 only shows an example, and that is by no means limited to the example. Furthermore, the conductive layer 12 that is served as the ground layer for supplying the earth potential is formed on almost entire region excepting the surface of the electrode pad 41 as described hereinabove in FIG. 13.

The invention accomplished by the inventors of the present invention has been described based on the example in detail, however, the present invention is by no means limited to the above-mentioned example, and as a matter of course various modifications may be applied without departing from the sprit and the scope of the present invention.

For example, in the case of the module shown in FIG. 1, (1) output power amplifiers 111 and 112, (2) impedance matching circuits 121 and 122, (3) low-pass filters 131 and 132, (4) transmission/reception switching circuits 141 and 142, (5) DC cut-off capacitances 151 and 152, and (6) diplexer 160 are mounted on one ceramic substrate to fabricate the module. However, the present invention may be applied to the case in which (1) output power amplifiers 111 and 112, (2) impedance matching circuits 121 and 122, and (3) low-pass filters 131 and 132 are used to fabricate one module, or the case in which (1) output power amplifiers 111 and 112, (2) impedance matching circuits 121 and 122, (3) low-pass filters 131 and 132, and (4) transmission/reception switching circuits 141 and 142 are used to fabricate one module. In all the cases, the same effect is obtained.

Furthermore, some conventional high frequency power amplifier modules are provided with a coupler for detecting the output level of the power amplifier and an APC (Automatic Power Control) circuit for controlling the bias voltage of the output transistor element based on the output supplied from the coupler on the rear end of the power amplifier so that the sufficient output power for communication can be obtained. Also in the case of the front end module of the present example, similar coupler and APC may be incorporated to form one module.

Furthermore, in the example shown in FIG. 2, only one low-pass filter 131 is connected to the rear end of the matching circuit 121, but additional one low-pass filter may be connected to the rear end of the above-mentioned low-pass filter to attenuate the higher harmonic wave of third order or higher. Furthermore, the resonance circuit PR is provided in the matching circuit 121 in the example shown in FIG. 2, but a matching circuit comprising a transmission line and capacitance element from which the resonance circuit is omitted may be used. A transmission/reception switching circuit 141 having the structure other than that shown in FIG. 2 may be used.

The case in which the present invention is applied to the front end module that is effectively used for the dual-band cellular phone that is capable of transmission/reception in two systems, namely GSM and DCS, which is the application field of the background for inventing the present invention accomplished by the inventors, is described hereinbefore. However, application of the present invention is by no means limited to the case, and the present invention may be applied to various wireless communication systems such as multi-band cellular phones and mobile telephones that are capable of transmission/reception in three or more systems.

The effect obtained by applying the typical invention out of inventions disclosed in the present patent application is described herein under.

The invention provides a wireless communication module that is capable of transmitting the fundamental wave with low loss and reducing the double higher harmonic wave level to the desired level or lower as the whole module in the case that a low-pass filter comprising a resonance circuit is provided on the rear end of a matching circuit. Furthermore, one module is sufficient for use thereby through two modules are used conventionally, and a miniaturized wireless communication system such as cellular phone is realized by using this type of module.

What is claimed is:

1. An electronic apparatus used for a wireless communication system that communicates by use of two or more frequency bands,
    wherein at least a set of an output power amplifier, a matching circuit, and a low-pass filter is provided correspondingly to each frequency band, the sets are mounted on one insulating substrate, and the output power amplifier, the matching circuit and the low-pass filter of each set are connected in this order,
    wherein in the case that the attenuation magnitude of the high order higher harmonic wave of any one of the frequency bands is specified to the first level to the double higher harmonic wave, the double higher harmonic wave is reduced due to the filtering characteristic of the low-pass filter, and
    wherein the phase of the double higher harmonic wave impedance in view of the low-pass filter side from the connection point between the matching circuit and the low-pass filter is deviated from the phase matching position by means of the low-pass filter to thereby reduce the double higher harmonic wave level to the first level or lower.

2. The electronic apparatus according to claim 1, wherein one of the two or more frequency bands is 900 MHz band for GSM system and the first level is −36 dBm specified in GSM system.

3. The electronic apparatus according to claim 2, wherein the filter functions to reduce the level to −30 dBm or lower because of the characteristic thereof.

4. The electronic apparatus according to claim 1, wherein other one of the two or more frequency bands is 1.8 GHz band for DCS system.

* * * * *